United States Patent
Du et al.

(10) Patent No.: US 11,262,406 B2
(45) Date of Patent: Mar. 1, 2022

(54) METHOD AND APPARATUS FOR CORRECTING SOC, BATTERY MANAGEMENT SYSTEM AND STORAGE MEDIUM

(71) Applicant: Contemporary Amperex Technology Co., Limited, Ningde (CN)

(72) Inventors: Mingshu Du, Ningde (CN); Shichao Li, Ningde (CN); Jian Ruan, Ningde (CN); Shenzhi Tang, Ningde (CN); Yanhua Lu, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 20 days.

(21) Appl. No.: 16/856,642

(22) Filed: Apr. 23, 2020

(65) Prior Publication Data

US 2020/0371163 A1    Nov. 26, 2020

(30) Foreign Application Priority Data

May 24, 2019   (CN) .......................... 201910441469.1

(51) Int. Cl.
    *G01R 31/367* (2019.01)
    *G01R 31/392* (2019.01)
    (Continued)

(52) U.S. Cl.
    CPC ....... *G01R 31/367* (2019.01); *G01R 31/3648* (2013.01); *G01R 31/374* (2019.01);
    (Continued)

(58) Field of Classification Search
    CPC .. G01R 31/367; G01R 31/392; G01R 31/396; G01R 31/3842; G01R 31/374;
    (Continued)

(56) References Cited

U.S. PATENT DOCUMENTS 6,356,083 B1    3/2002   Ying
10,330,738 B2   6/2019   Kim
(Continued)

FOREIGN PATENT DOCUMENTS

CN    102487209 A    6/2012
CN    103439668 A    12/2013
(Continued)

OTHER PUBLICATIONS

The First Official Action and search report dated Sep. 17, 2020 for Chinese application No. 201910441469.1, 24 pages.
(Continued)

*Primary Examiner* — M Baye Diao
(74) *Attorney, Agent, or Firm* — Law Offices of Liaoteng Wang

(57) ABSTRACT

A method and apparatus for correcting a state of charge (SOC), a battery management system and a storage medium are provided. The method includes: acquiring state data of a battery cell in a case where the battery cell meets a preset standing condition; determining, according to the state data of the battery cell, a near-steady-state battery model for characterizing a change in an open circuit voltage (OCV) over time in a near-steady-state and a steady-state time period threshold for characterizing whether a standing time period is sufficient; processing the steady-state time period threshold by using the near-steady-state battery model to obtain an estimated steady-state OCV value; determining a SOC corresponding to the estimated steady-state OCV value by using a preset correspondence between steady-state OCVs and SOCs; and correcting a current SOC by using the SOC corresponding to the estimated steady-state OCV value.

11 Claims, 4 Drawing Sheets

(51) Int. Cl.
　　　*G01R 31/396*　　　(2019.01)
　　　*G01R 31/3842*　　(2019.01)
　　　*G01R 31/374*　　　(2019.01)
　　　*G01R 31/36*　　　(2020.01)
　　　*H01M 10/42*　　　(2006.01)
(52) U.S. Cl.
　　　CPC ....... *G01R 31/3842* (2019.01); *G01R 31/392* (2019.01); *G01R 31/396* (2019.01); *H01M 10/425* (2013.01); *H01M 2010/4271* (2013.01)
(58) Field of Classification Search
　　　CPC .............. G01R 31/3648; G01R 31/382; G01R 31/388; H01M 10/425; H01M 2010/4271; Y02E 60/10
　　　USPC ........................................................ 320/132
　　　See application file for complete search history.

(56) References Cited

U.S. PATENT DOCUMENTS

| | | | |
|---|---|---|---|
| 10,871,521 B2* | 12/2020 | Ruan | ................... G01R 31/3648 |
| 2003/0214303 A1 | 11/2003 | Ying | |
| 2012/0143585 A1 | 6/2012 | Barsukov et al. | |
| 2013/0158916 A1 | 6/2013 | Baruzzi et al. | |
| 2015/0032394 A1 | 1/2015 | Kimura et al. | |
| 2018/0111599 A1* | 4/2018 | Wang | ................... B60W 10/06 |
| 2018/0321324 A1 | 11/2018 | Karippumannil Prasad et al. | |

FOREIGN PATENT DOCUMENTS

| | | |
|---|---|---|
| CN | 105467328 A | 4/2016 |
| CN | 105629173 A | 6/2016 |
| CN | 106026260 A | 10/2016 |
| CN | 106646265 A | 5/2017 |
| CN | 106908730 A | 6/2017 |
| CN | 107167738 A | 9/2017 |
| CN | 107340479 A | 11/2017 |
| CN | 107656206 A | 2/2018 |
| CN | 108445422 A | 8/2018 |
| CN | 108928245 A | 12/2018 |
| CN | 109613432 A | 4/2019 |
| CN | 110967646 A | 4/2020 |
| WO | 2017144110 A | 8/2017 |

OTHER PUBLICATIONS

PCT International Search Report for PCT/CN2020/089178, dated Jul. 28, 2020, 14 pages.

The Extended European search report dated Oct. 20, 2020 for European application No. 20171922.6, 10 pages.

The second office action and search report dated Dec. 28, 2020 for Chinese Application No. 201910441469.1, 10 pages.

* cited by examiner

METHOD AND APPARATUS FOR CORRECTING SOC, BATTERY MANAGEMENT SYSTEM AND STORAGE MEDIUM

CROSS-REFFERENCE TO RELATED APPLICATION

The present application is based upon and claims priority to Chinese Patent Application No. 201910441469.1, filed on May 24, 2019, which is incorporated herein by reference in its entirety.

TECHNICAL FIELD

The present invention relates to the field of battery technologies, and in particular, to a method and an apparatus for correcting SOC, a battery management system, and a storage medium.

BACKGROUND

The State of Charge (SOC) represents a ratio of a remaining capacity of a battery with respect to a capacity of the battery in fully charged state, where the remaining capacity of the battery refers to a capacity remained after the battery is used for a period of time or laid aside for a long time. When SOC=0, it indicates that the battery is completely discharged, and when SOC=1, it indicates that the battery is fully charged. SOC estimation is one of the most important functions of a battery management system, and used to enable power indication, remaining mileage presentation, over-charge and over-discharge protection, battery balancing, charge control and battery health prediction of the battery management system.

Conventionally, the SOC estimation is mainly performed by using an open circuit voltage method. Specifically, SOC of the battery in a steady state (i.e., steady-state SOC) is obtained by using a corresponding between open circuit voltages (OCVs) in steady state of a battery cell and SOCs.

However, acquisition of a steady-state OCV usually requires a battery cell to be let stand still for a long time (more than a few hours), but in an actual use situation, there is little chance to let a battery cell stand still for a long time, so there is little chance to get a steady-state OCV of the battery cell, reducing applicability of the open circuit voltage method.

SUMMARY

The embodiments of the disclosure provides a method and an apparatus for correcting SOC, a battery management system and a storage medium, with which a steady-state OCV of a battery cell can be quickly estimated by using characteristics of an external circuit during a short standing time period of the battery, and applicability of an open circuit voltage method can be improved.

In a first aspect, an embodiment of the disclosure provides a method for correcting a SOC, including: acquiring state data of a battery cell in a case where the battery cell meets a preset standing condition; determining, according to the state data of the battery cell, a near-steady-state battery model for characterizing a change in an open circuit voltage (OCV) over time in a near-steady state and a steady-state time period threshold for characterizing whether a standing time period is sufficient; processing the steady-state time period threshold by using the near-steady-state battery model to obtain an estimated steady-state OCV value; determining a SOC corresponding to the estimated steady-state OCV value by using a preset correspondence between steady-state OCVs and SOCs; and correcting a current SOC by using the SOC corresponding to the estimated steady-state OCV value.

In a possible implementation of the first aspect, the preset standing condition indicates that a current of the battery cell is less than a preset current threshold.

In a possible implementation of the first aspect, the state data of the battery cell includes: SOH, voltage, current, and temperature, wherein all pending parameters of the near-steady-state battery model are determined based on SOH, voltage, current, and temperature at current time; or a part of the pending parameters of the near-steady-state battery model are determined based on SOH, voltage, current, and temperature at current time, and remaining pending parameters of the near-steady-state battery model are determined by fitting of all voltage data from start time of the standing condition to current time.

In a possible implementation of the first aspect, the steady-state time period threshold is determined by the SOH and/or the temperature at the current time.

In a possible implementation of the first aspect, the processing the near-steady-state time period threshold by using the near-steady-state battery model to obtain the estimated steady-state OCV value includes: determining whether the state data of the battery cell meets a preset trustable parameter condition; and processing the near-steady-state time period threshold by using the near-steady-state battery model to obtain the estimated steady-state OCV value when the state data of the battery cell meets the preset trustable parameter condition, wherein the preset trustable parameter condition comprises: a change in voltage of the battery cell during the standing time period is greater than a preset change threshold, a temperature of the battery cell during the standing time period is within a preset temperature range, and the standing time period of the battery cell is greater than a first preset length of time period.

In a possible implementation of the first aspect, the determining whether the state data of the battery cell meets the preset trustable parameter condition may be performed when the battery cell has not met the preset standing condition and/or each time when the battery cell has been in a standing state for a second preset length of time period.

In a possible implementation of the first aspect, the method further include: calculating, when the state data of the battery cell does not meet the preset trustable parameter condition, an unsteady-state OCV, wherein the unsteady-state OCV is a difference of a voltage of the battery cell at an ending moment of a current standing time period and a polarization voltage compensation value; determining a SOC corresponding to the unsteady-state OCV by using a preset correspondence between unsteady-state OCVs and SOCs; and correcting the current SOC by using the SOC corresponding to the unsteady-state OCV.

In a possible implementation of the first aspect, the polarization voltage compensation value is determined by a current and a temperature of the battery cell at the ending moment of the current standing time period, or voltages and temperatures of the battery cell during the current standing time period.

In a possible implementation of the first aspect, the correcting the current SOC by using the SOC corresponding to the unsteady-state OCV includes: determining a voltage rebound direction of the battery cell during the current standing time period; correcting the current SOC by using the SOC corresponding to the unsteady-state OCV when the voltage rebound direction indicates a voltage increase and the SOC corresponding to the unsteady-state OCV is greater than the current SOC; and correcting the current SOC by using the SOC corresponding to the unsteady-state OCV when the voltage rebound direction indicate a voltage decrease, and the SOC corresponding to the unsteady-state OCV is smaller than the current SOC.

In a possible implementation of the first aspect, the correcting the current SOC by using the SOC corresponding to the unsteady-state OCV includes: calculating a difference between the SOC corresponding to the unsteady-state OCV and the current SOC; and correcting the current SOC by using the SOC corresponding to the unsteady-state OCV when an absolute value of the difference is greater than a preset difference threshold.

In a second aspect, an embodiment of the disclosure provides an apparatus for correcting a SOC, including: a state data of battery cell acquisition module configured to acquire state data of a battery cell in a case where the battery cell meets a preset standing condition; a near-steady-state battery model and a steady-state time period threshold determination module configured to determine, according to the state data of the battery cell, a near-steady-state battery model for characterizing a change in an open circuit voltage (OCV) over time in a near-steady-state and a steady-state time period threshold for characterizing whether a standing time period is sufficient; a steady-state OCV estimation module configured to process the steady-state time period threshold by using the near-steady-state battery model to obtain an estimated steady-state OCV value; a SOC determination module configured to determine a SOC corresponding to the estimated steady-state OCV value by using a preset correspondence between steady-state OCVs and SOCs; and a SOC correction module configured to correct a current SOC by using the SOC corresponding to the estimated steady-state OCV value.

In a third aspect, an embodiment of the disclosure provides a battery management system, including the apparatus for correcting the SOC according as described above.

In a fourth aspect, an embodiment of the disclosure provides a storage medium having a program stored thereon, wherein the program is executed by a processor to implement the method for correcting the SOC as described above.

As described above, in order to avoid a problem that acquisition of a steady-state OCV requires a battery to be let stand still for a long time during SOC estimation, the embodiments of the disclosure firstly determines a near-steady-state battery model according to state data of a battery cell in a case where the battery cell meets a preset standing condition to characterize variation trend of OVC over time in a near-steady state, then use the near-steady-state battery model to process a steady-state time period threshold to obtain an estimated steady-state OCV value, and then use a preset correspondence between steady-state OCVs and SOCs to determine a SOC correspond to the estimated steady-state OCV. The determined SOC correspond to the estimated steady-state OCV is then used to correct a current SOC.

Compared with the conventional open circuit voltage method, it is possible for the embodiments of the present invention to determine a near-steady-state battery model for characterizing a change in an open circuit voltage over time in a near-steady state by using characteristics of an external circuit during a short standing time period of the battery and use the near-steady-state battery model to estimate a steady-state OCV, reducing time required to obtain a steady-state OCV and in turn increasing a chance of correction of SOC so that applicability of an open circuit voltage method can be improved.

BRIEF DESCRIPTION OF THE DRAWINGS

The disclosure may be better understood from the following description of embodiments of the disclosure. In the accompanying drawings, the same or like reference signs denotes the same or like features.

DETAILED DESCRIPTION

Features and exemplary embodiments of various aspects of the disclosure are described in detail below. In the following detailed description, numerous specific details are set forth in order to provide complete understanding of the disclosure.

The embodiments of the present invention provides a method and an apparatus for correcting SOC, a battery management system and a storage medium. With the technical solution in the embodiments of the disclosure, it is possible to determine a model when an open circuit voltage of a battery become steady and estimate the open circuit voltage in the steady state by using characteristics of an external circuit during a short standing time period of the battery so as to reduce time required for acquisition of an open circuit voltage in the steady state, thereby solving a problem that acquisition of a steady-state open circuit voltage requires a long time, and increasing a chance of correction of SOC so that applicability of an open circuit voltage method can be improved.

Figure 1:
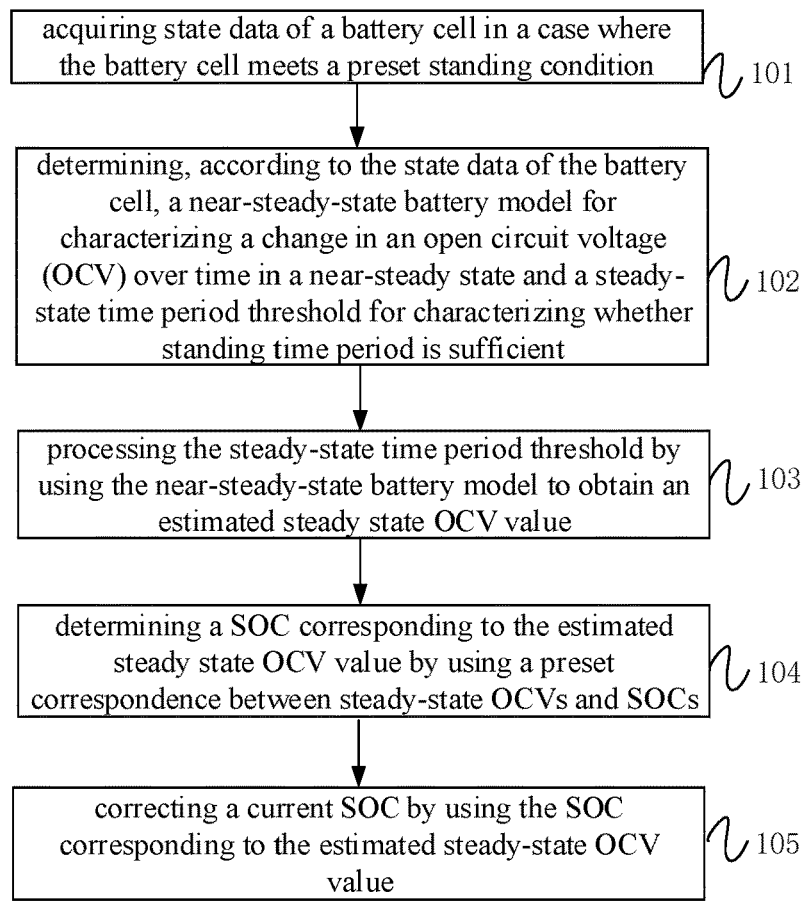
FIG. 1 is a schematic flowchart of a method for correcting SOC according to an embodiment of the disclosure.

FIG. 1 is a schematic flowchart diagram of a method for correcting SOC according to an embodiment of the disclosure. As shown in FIG. 1, the method for correcting SOC includes steps 101 to 105.

In step 101, state data of a battery cell in a case where the battery cell meets a preset standing condition is acquired.

The state data of the battery cell may include: State of Health (SOH). SOH is a percentage of a full capacity of a battery relative to a rated capacity of the battery, and is used to indicate ability of the battery to store charge. The SOH of a new battery from a factory is 100%, and the SOH of a completely scrapped battery is 0%. The value of SOH in a short time period can be considered unchanged.

The state data of the battery cell may further include: voltage, current, temperature, and the like.

In an example, the preset standing condition may indicate that a current of the battery cell is less than a preset current threshold.

The preset current threshold may be determined by looking up a correspondence between pre-calibrated SOCs, temperatures and preset current thresholds based SOC and temperature of the battery cell at current time.

In an specific implementation, when the battery cell meets the preset standing condition, SOH of the battery cell, a voltage sequence UList[V1, V2, ... Vn], a current sequence IList=[I1, I2, ..., In], a temperature sequence TList=[T1, T2, ... Tn] and a time sequence TimeList=[t1, t2, ... tn] may be recorded, and a time period Te in the case where the standing condition is met is accumulated.

In step 102, according to the state data of the battery cell, a near-steady-state battery model for characterizing a change in an open circuit voltage (OCV) over time in a near-steady state and a steady-state time period threshold Tt for characterizing whether a standing time period is sufficient are determined.

In this step, if the current standing time reaches a steady-state time period threshold Tt, it indicates that it is time to calculate an estimated steady-state OCV value according to the near-steady-state battery model.

In a specific implementation, the steady-state time period threshold Tt can be determined by looking up a correspondence between pre-calibrated SOHs and/or temperatures and steady-state time period thresholds based on SOH and temperature of the battery cell at current time.

Figure 2:
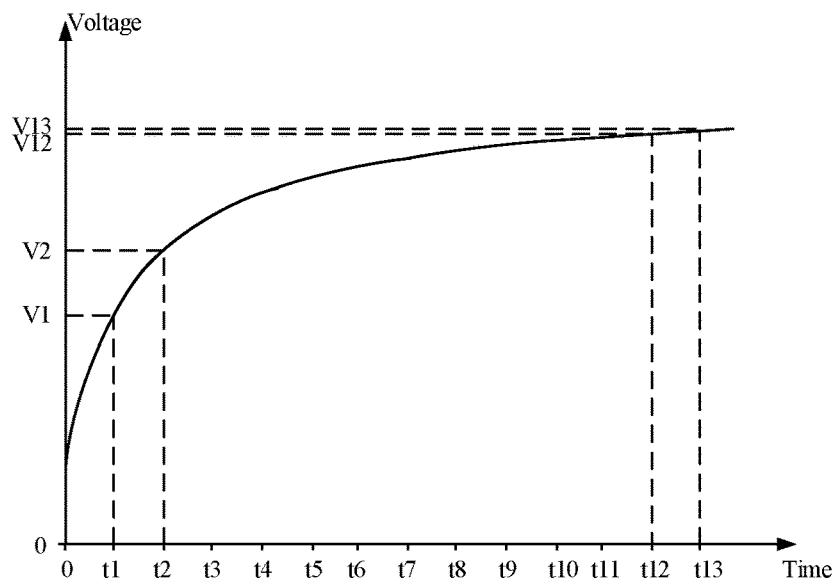
FIG. 2 is a schematic graph of voltages over time based on a time sequence and a corresponding voltage sequence according to an embodiment of the disclosure.

FIG. 2 is a schematic graph of voltages over time based on a time sequence and a corresponding voltage sequence according to an embodiment of the disclosure.

In FIG. 2, the horizontal ordinate indicates time, the longitudinal coordinates indicate voltage. The voltage at time t1 is V1, the voltage at time t2 is V2, the voltage at time t12 is V12, and the voltage at time t13 is V13.

According to an embodiment of the disclosure, the near-steady-state battery model can be utilized to characterize variation curves in FIG. 2.

Three near-steady-state battery models are given below, where V(t) is a voltage of the battery as a function of time during the steady state:

Model 1:

$$V(t) = a_1 - b_1 t^{c_1'} e^{c_1/t} \log_e^{d_1}(t) \quad (1)$$

where $a_1, b_1, c_1, d_1, d_2$ are specific model parameters, and e is a natural base.

Model 2:

$$V(t) = a_2 + b_2/(c_2 + e^{d_2 t}) \quad (2)$$

where $a_2, b_2, c_2, d_2$ are specific model parameters, and e is a natural base.

Model 3:

$$V(t) = a_3 - b_3 e^{c_3 t} \quad (3)$$

where $a_3, b_3, c_3$ are specific model parameters, and e is a natural base.

It should be noted that the near-steady-state battery model according to the embodiments of the disclosure is not limited to the above three types, and includes simplification and deformation of respective models, which are not limited herein.

In step 103, the steady-state time period threshold Tt is processed by using the near-steady-state battery model to obtain an estimated steady-state OCV value.

In a specific implementation, it is possible to apply the steady-state time threshold Tt in the above-mentioned steady-state battery model, and an output value is the estimated steady-state OCV value.

In step 104, a SOC corresponding to the estimated steady-state OCV value is determined by using a preset correspondence between steady-state OCVs and SOCs.

In step 105, a current SOC is corrected by using the SOC corresponding to the estimated steady-state OCV value.

That is, the SOC corresponding to the estimated steady-state OCV value is used as a new SOC.

As described above, in order to avoid a problem that acquisition of a steady-state OCV requires a battery cell to be let stand still for a long time during SOC estimation, the embodiments of the disclosure firstly determines a near-steady-state battery model according to state data of a battery cell in a case where the battery cell meets a preset standing condition to characterize variation trend of OVC over time in a near-steady state, then use the near-steady-state battery model to process a steady-state time period threshold to obtain an estimated steady-state OCV value, and then use a preset correspondence between steady-state OCVs and SOCs to determine a SOC correspond to the estimated steady-state OCV. The determined SOC correspond to the estimated steady-state OCV is then used to correct a current SOC.

Compared with the conventional open circuit voltage method, it is possible for the embodiments of the present invention to determine a near-steady-state battery model for characterizing a change in an open circuit voltage over time in a near-steady state and use the near-steady-state battery model to estimate a steady-state OCV, reducing time required to obtain a steady-state OCV and in turn increasing a chance of correction of SOC so that applicability of an open circuit voltage method can be improved.

Determination of pending parameters of the near-steady-state battery model will be described below.

In an example, all pending parameters of the near-steady-state battery model may be determined by looking up an offline predetermined correspondence between model pending parameters and SOHs, voltages, currents as well as temperatures based on SOH, voltage, current, and temperature at current time.

In an example, a part of the pending parameters of the near-steady-state battery model may be determined based on SOH, voltage, current, and temperature at current time, and remaining pending parameters of the near-steady-state battery model may be determined by fitting of a voltage sequence [V1, V2, ... Vn] from start time of the standing condition to current time. Fitting algorithm may include, but is not limited to, least square method and variations thereof, genetic algorithm or other parameter fitting methods, and the like.

For example, for the near-steady-state battery model 3 discussed above, the model parameter c3 may be determined by looking up an offline predetermined correspondence between model parameters c3 and SOHs, voltages, currents as well as temperatures based on SOH, voltage, current, and temperature of the battery cell at current time, and a recursive least square method is used to perform fitting on UList=[V1, V2, ... Vn] to obtain the pending parameters a3 and b3.

It should be noted that a person skilled in the art can select an appropriate method to determine model pending parameters according to requirements, which is not limited herein. In addition, determination of the pending parameters of the near-steady-state battery model in the embodiments of the disclosure may be continuously performed, that is, the pending parameters of the near-steady-state battery model may be continuously updated as the standing time period of the battery cell is extended.

Figure 3:
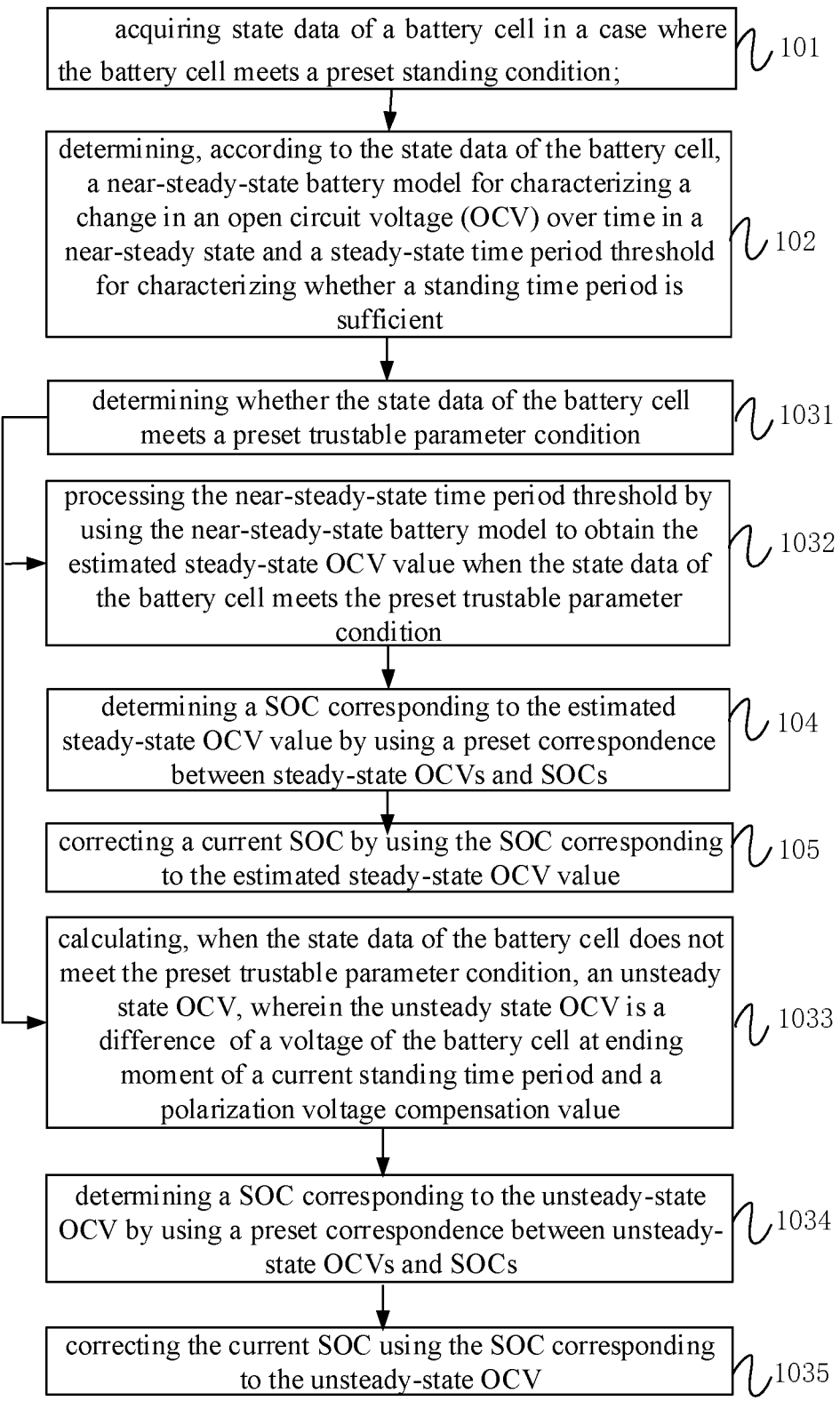
FIG. 3 is a schematic flowchart of a method for correcting SOC according to another embodiment of the disclosure.

FIG. 3 is a schematic flowchart diagram of a method for correcting SOC according to another embodiment of the disclosure.

FIG. 3 is different from FIG. 1 in that the step 103 in FIG. 1 are divided into steps 1031 to 1035 in FIG. 3.

In step 1031, it is determined whether the state data of the battery cell meets a preset trustable parameter condition.

The preset trustable parameter condition may include: a change in voltage of the battery cell during the standing time period is greater than a preset change threshold, a temperature of the battery cell during the standing time period is within a preset temperature range, and the standing time period of the battery cell is greater than a first preset length of time period.

In the embodiments of the disclosure, it is possible to ensure voltage data for use in determination of parameters of the near-steady-state battery model is sufficient by limiting change value of voltage and the standing time period, and it is possible to ensure voltage data for use in determination of parameters of the near-steady-state battery model is within normal operation conditions by limiting the temperature, thereby improving accuracy of the model estimation.

According to an embodiment of the disclosure, the determining whether the state data of the battery cell meets the preset trustable parameter condition may be performed at the following situations:

(1) the battery cell does not meet the preset standing condition. That is, state data of the battery cell is continuously collected during the standing situation until the battery cell does not meet the preset standing condition, and at this time point a determination regarding the trustable parameter condition may be performed.

(2) each time when the battery cell has been in a standing state for a second preset length of time period. That is, state data of the battery cell is continuously collected during the standing situation, and every a certain time period (i.e., the second preset length of time period), a determination regarding the trustable parameter condition calculation of steady-state OCV may be performed.

A person skilled in the art can select any one of the situations or combination thereof as needed, which is not limited herein.

In step 1032, if the state data of the battery cell meets the preset trustable parameter condition, the steady-state time period threshold is processed by using the near-steady-state battery model to obtain an estimated steady-state OCV value. Then, step 104 and step 105 are performed to determine a SOC corresponding to the estimated steady-state OCV value by using a preset correspondence between steady-state OCVs and SOCs and correct a current SOC by using the SOC corresponding to the estimated steady-state OCV value.

In step 1033, when the state data of the battery cell meets the preset trustable parameter condition, an unsteady-state OCV is calculated.

The unsteady-state OCV is a difference of a voltage of the battery cell at an ending moment of a current standing time period and a polarization voltage compensation value.

In an example, the voltage of the battery cell at the ending moment of the current standing time period and the polarization voltage compensation value at the moment may be determined by looking up a predetermined correspondence between polarization voltage compensation values and currents as well as temperatures based on current and temperature of the battery cell at ending moment of the current standing time period.

In an example, the polarization voltage compensation value may be determined by looking up a predetermined correspondence between polarization voltage compensation values and statistical characteristics based on statistical characteristic (e.g. root-mean-square value, etc.) of voltage and temperature of the battery cell during the current standing time period.

In step 1034, a SOC corresponding to the unsteady-state OCV is determined by using a preset correspondence between unsteady-state OCVs and SOCs.

In step 1035, the current SOC is corrected by using the SOC corresponding to the unsteady-state OCV.

That is to say, as compared with conventional open circuit voltage method, it is possible for the embodiments of the disclosure to determine the unsteady OCV even if the state data of the battery cell does not meet the preset trustable parameter condition, thereby reducing time required for acquisition of the steady-state OCV and in turn increasing a chance of correction of SOC so that applicability of an open circuit voltage method can be improved.

In an alternative embodiment, rather than direct correction with the steady-state OCV, the following correction strategy may be employed before the current SOC is corrected by using the SOC corresponding to the unsteady OCV in order to avoid overcorrection of the SOC:

a voltage rebound direction of the battery cell during the current standing time period is determined;

when the voltage rebound direction indicates a voltage increase, that is, when the curve of voltages during the standing time period over time is monotonically increasing, indicating that the SOC corresponding to the unsteady-state OCV is a lower limit of a trustable SOC, it is determined whether the SOC corresponding to the unsteady-state OCV is greater than the current SOC, and then the SOC corresponding to the unsteady-state OCV is used to correct the current SOC;

when the voltage rebound direction indicates a voltage decrease, that is, when the curve of voltages during the standing time period over time is monotonically decreasing, indicating that the SOC corresponding to the unsteady-state OCV is a upper limit of a trustable SOC, it is determined whether the SOC corresponding to the unsteady-state OCV is smaller than the current SOC, and then the SOC corresponding to the unsteady-state OCV is used to correct the current SOC;

In an alternative embodiment, rather than direct correction with the steady-state OCV, the following correction strategy may be employed before the current SOC is corrected by using the SOC corresponding to the unsteady OCV in order to save computational resources:

a difference between the SOC corresponding to the unsteady-state OCV and the current SOC is calculated;

when an absolute value of the difference is greater than a preset difference threshold, the current SOC corrected by using the SOC corresponding to the unsteady-state OCV.

Further, in order to avoid overcorrection, a weighting process may be performed on the SOC corresponding to the unsteady-state OCV and the current SOC and the current SOC is corrected by using the weighted SOC.

In the embodiment, the SOC corresponding to the unsteady-state OCV may be used as a SOC having a certain degree of confidence, so as to filter the current SOC that is seriously inaccurate to obtain a SOC with a slightly smaller error. In an example, an average of the current SOC and the SOC corresponding to the unsteady-state OCV may be calculated, and the current SOC is then corrected by using the average. Of course, the SOC corresponding to the unsteady-state OCV may be applied an increased weight, which is not limited herein.

Figure 4:
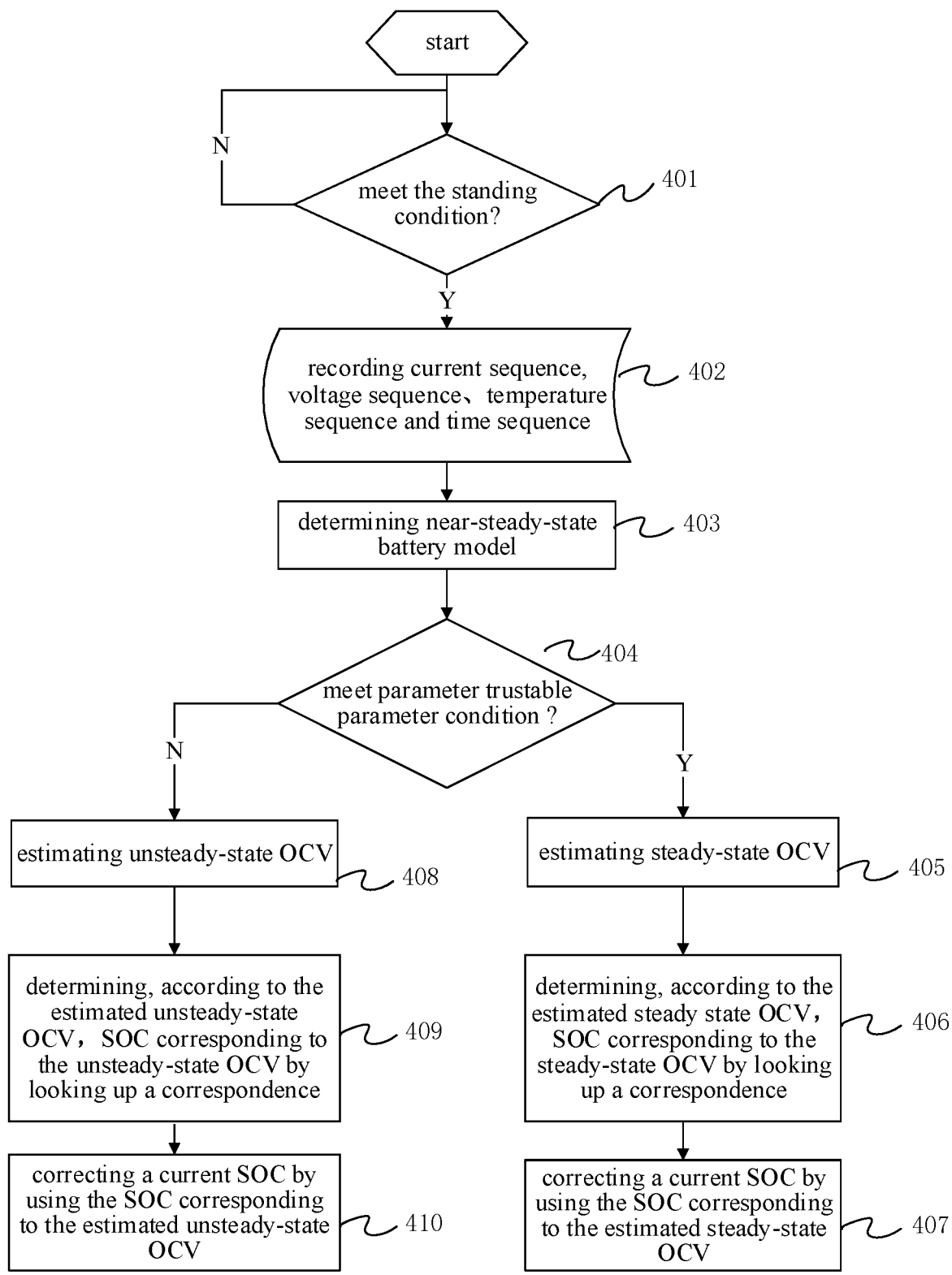
FIG. 4 is a schematic flowchart diagram of a method for correcting SOC according to another embodiment of the disclosure.

FIG. 4 is a schematic flowchart diagram of a method for correcting SOC according to another embodiment of the disclosure.

The method for correcting SOC shown in FIG. 4 includes steps 401 to 410 for illustrating the method for correcting SOC of the embodiments of the disclosure.

In step 401, it is determined whether the battery cell meets a preset standing condition, and if so, the method proceeds to step 402, otherwise the method goes back to step 401.

In step 402, in the case where the battery cell meets a preset standing condition, a voltage sequence, a current sequence, a temperature sequence of the battery cell and a time sequence are recorded.

In step 403, pending parameters of a near-steady-state battery model are determined based on SOH of the battery cell at current time and the voltage sequence, the current sequence, the temperature sequence.

In step 404, it is determined whether a preset trustable parameter condition is met, and if so, the method precedes to step 405, otherwise the method proceeds to step 408.

In step 405, an OCV (steady-state OCV) at a steady state is estimated based on the near-steady-state battery model determined in step 403.

In step 406, a SOC corresponding to the estimated steady-state OCV is determined by looking up a correspondence between steady-state OCVs and SOCs based on the estimated steady-state OCV.

In step 407, a current SOC is corrected based on the SOC corresponding to the estimated steady-state OCV.

In step 408, an unsteady-state OCV is estimated.

In step 409, a SOC corresponding to the estimated unsteady-state OCV is determined by looking up a correspondence between unsteady-state OCVs and SOCs based on the estimated unsteady-state OCV.

In step 410, a current SOC is corrected based on the SOC corresponding to the estimated unsteady-state OCV.

Figure 5:
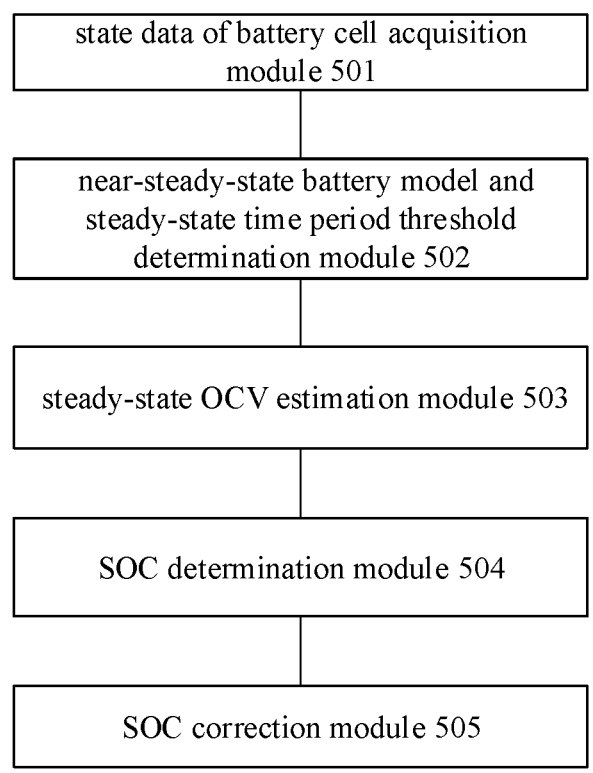
FIG. 5 is a schematic structural diagram of an apparatus for correcting SOC according to an embodiment of the disclosure.

FIG. 5 is a schematic structural diagram of an apparatus for correcting SOC according to an embodiment of the disclosure. As shown in FIG. 5, the apparatus includes: a state data of battery cell acquisition module 501, a near-steady-state battery model and steady-state time period threshold determination module 502, steady-state OCV estimation module 503, SOC determination module 504, and SOC correction module 505.

The state data of battery cell acquisition module 501 is configured to acquire state data of a battery cell in a case where the battery cell meets a preset standing condition.

The near-steady-state battery model and steady-state time period threshold determination module 502 is configured to determine, according to the state data of the battery cell, a near-steady-state battery model for characterizing a change in an open circuit voltage (OCV) over time in a near-steady state and a steady-state time period threshold for characterizing whether a standing time period is sufficient.

The steady-state OCV estimation module 503 is configured to process the steady-state time period threshold by using the near-steady-state battery model to obtain an estimated steady-state OCV value.

The SOC determination module 504 is configured to determine a SOC corresponding to the estimated steady-state OCV value by using a preset correspondence between steady-state OCVs and SOCs.

The SOC correction module 505 is configured to correct a current SOC by using the SOC corresponding to the estimated steady-state OCV value.

The embodiments of the disclosure also provide a battery management system including the apparatus for correcting SOC as described above.

The embodiments of the disclosure also provide a storage medium having a program stored thereon, wherein the program is executed by the processor to perform the method for correcting SOC as described above.

It is to be understood that the various embodiments in the disclosure are described in a progressive manner, and the same or similar parts between the various embodiments may be referred to each other, and each embodiment focuses on differences from other embodiments. For the apparatus embodiment, relevant aspects can be found in the description section of the method embodiment. The embodiments of the disclosure are not limited to the specific steps and structures described above and illustrated in the drawings. A person skilled in the art can make various changes, modifications and additions, or change the order between the steps under the spirit of the embodiments of the disclosure. Also, a detailed description of known method techniques is omitted herein for the sake of brevity.

The functional blocks shown in the block diagrams described above may be implemented as hardware, software, firmware, or a combination thereof. When implemented in hardware, it can be, for example, an electronic circuit, an application specific integrated circuit (ASIC), suitable firmware, plug-ins, function cards, and the like. When implemented in software, the elements of the embodiments of the disclosure may be programs or code segments that can be used to perform required tasks. The program or code segments may be stored in a machine readable medium or transmitted over a transmission medium or communication link through a data signal carried in the carrier. A "machine-readable medium" may include any medium that can store or transfer information. Examples of machine-readable media include electronic circuits, semiconductor memory devices, ROM, flash memory, erasable ROM (EROM), floppy disks, CD-ROMs, optical disks, hard disks, fiber optic media, radio frequency (RF) links, and the like. The code segments may be downloaded via a computer network such as the Internet, an intranet, and the like.

The embodiments of the disclosure may be embodied in other specific forms without departing from the spirit and essential characteristics thereof. For example, the algorithms described in the specific embodiments may be modified, while the system architecture does not depart from the basic spirit of the embodiments of the disclosure. The present embodiments are to be considered in all respects as illustrative and not limiting, and the scope of the embodiments of the disclosure is determined by the appended claims rather than the descriptions. All changes within scope of the claims and equivalents thereof are thus included in the scope of the embodiments of the disclosure.

What we claimed is:

1. A method for correcting a state of charge (SOC), the method comprising:
   recording state of health (SOH), a voltage sequence, a current sequence, a temperature sequence and a time sequence of a battery cell and accumulating a standing time period when the battery cell is under a preset standing condition, wherein the preset standing condition is that a current of the battery cell is less than a preset current threshold;
   determining an estimated steady-state open circuit voltage (OCV) value based on the time sequence, the voltage sequence and a steady-state time period threshold when the standing time period reaches the steady-state time period threshold, wherein steady-state time period threshold is determined based on SOH and temperature of the battery cell at current time;

determining an SOC corresponding to the estimated steady-state OCV value by looking up a first preset correspondence between steady-state OCVs and SOCs; and correcting a current SOC by using the SOC corresponding to the estimated steady-state OCV value, wherein the current SOC is obtained by using an open circuit voltage method.

2. The method according to claim 1, further comprising:
determining whether a preset trustable parameter condition is met; and
the estimated steady-state OCV value is calculated when the preset trustable parameter condition is met;
wherein the preset trustable parameter condition comprises: a change in voltage of the battery cell during the standing time period is greater than a preset change threshold, a temperature of the battery cell during the standing time period is within a preset temperature range, and the standing time period of the battery cell is greater than a first preset length of time period.

3. The method according to claim 2, wherein the determining whether the preset trustable parameter condition is met is performed when the battery cell does not meet the preset standing condition and/or each time when the battery cell meet the preset standing condition for a second preset length of time period.

4. The method according to claim 2, wherein the method further comprises:
calculating, when the preset trustable parameter condition is not met, an unsteady-state OCV, wherein the unsteady-state OCV is a difference between a voltage of the battery cell at an ending moment of the standing time period and a polarization voltage compensation value, wherein the polarization voltage compensation value is determined by looking up a preset correspondence between currents, temperatures and polarization voltage compensation values based on a current and a temperature of the battery cell at the ending moment of the standing time period, or determined by looking up a preset correspondence between statistical characteristics of voltages and temperatures and polarization voltage compensation values based on statistical characteristics of voltages and temperatures of the battery cell during the standing time period;
determining an SOC corresponding to the unsteady-state OCV by looking up a second preset correspondence between unsteady-state OCVs and SOCs; and
correcting the current SOC by using the SOC corresponding to the unsteady-state OCV.

5. The method according to claim 4, wherein the correcting the current SOC by using the SOC corresponding to the unsteady-state OCV comprises:
determining a voltage rebound direction of the battery cell during the standing time period;
correcting the current SOC by using the SOC corresponding to the unsteady-state OCV when the voltage rebound direction indicates a voltage increase and the SOC corresponding to the unsteady-state OCV is greater than the current SOC; and
correcting the current SOC by using the SOC corresponding to the unsteady-state OCV when the voltage rebound direction indicates a voltage decrease and the SOC corresponding to the unsteady-state OCV is smaller than the current SOC.

6. The method according to claim 4, wherein the correcting the current SOC by using the SOC corresponding to the unsteady-state OCV comprises:
calculating a difference between the SOC corresponding to the unsteady-state OCV and the current SOC; and
correcting the current SOC by using the SOC corresponding to the unsteady-state OCV when an absolute value of the difference is greater than a preset difference threshold.

7. The method according to claim 4, wherein the correcting the current SOC by using the SOC corresponding to the unsteady-state OCV comprises:
performing a weighting process on the SOC corresponding to the unsteady-state OCV and the current SOC, and
correcting the current SOC by using the weighted SOC.

8. An apparatus for correcting a state of charge (SOC), the apparatus comprising:
a processor;
a memory storing a program;
wherein the processor is configured to:
record state of health (SOH), a voltage sequence, a current sequence, a temperature sequence and a time sequence of a battery cell and accumulating a standing time period when the battery cell is under a preset standing condition, wherein the preset standing condition is that a current of the battery cell is less than a preset current threshold;
determine an estimated steady-state open circuit voltage (OCV) value based on the time sequence, the voltage sequence and a steady-state time period threshold when the standing time period reaches the steady-state time period threshold, wherein steady-state time period threshold is determined based on SOH and temperature of the battery cell at current time;
determine a state of charge (SOC) corresponding to the estimated steady-state OCV value by looking up a first preset correspondence between OCVs and SOCs; and
correct a current SOC by using the SOC corresponding to the estimated steady-state OCV value, wherein the current SOC is obtained by using an open circuit voltage method.

9. The apparatus according to claim 8, wherein the processor is further configured to:
determine whether a preset trustable parameter condition is met; and
the estimated steady-state OCV value is calculated when the preset trustable parameter condition is met;
wherein the preset trustable parameter condition comprises: a change in voltage of the battery cell during the standing time period is greater than a preset change threshold, a temperature of the battery cell during the standing time period is within a preset temperature range, and the standing time period of the battery cell is greater than a first preset length of time period.

10. The apparatus according to claim 9, wherein the processor is further configured to:
calculate, when the preset trustable parameter condition is not met, an unsteady-state OCV, wherein the unsteady-state OCV is a difference between a voltage of the battery cell at an ending moment of the standing time period and a polarization voltage compensation value, wherein the polarization voltage compensation value is determined by looking up a preset correspondence between currents, temperatures and polarization voltage compensation values based on a current and a temperature of the battery cell at the ending moment of the standing time period, or determined by looking up a preset correspondence between statistical characteristics of voltages and temperatures and polarization voltage compensation values based on statistical characteristics of voltages and temperatures of the battery cell during the standing time period;

determine an SOC corresponding to the unsteady-state OCV by looking up a second preset correspondence between unsteady-state OCVs and SOCs; and correct the current SOC by using the SOC corresponding to the unsteady-state OCV.

11. The apparatus according to claim 10, wherein the processor is further configured to:

determine a voltage rebound direction of the battery cell during the standing time period;

correct the current SOC by using the SOC corresponding to the unsteady-state OCV when the voltage rebound direction indicates a voltage increase and the SOC corresponding to the unsteady-state OCV is greater than the current SOC; and correct the current SOC by using the SOC corresponding to the unsteady-state OCV when the voltage rebound direction indicates a voltage decrease and the SOC corresponding to the unsteady-state OCV is smaller than the current SOC.

* * * * *